(12) United States Patent
Rouaissia et al.

(10) Patent No.: US 11,698,697 B2
(45) Date of Patent: Jul. 11, 2023

(54) MULTICHANNEL CAPACITIVE SENSOR DEVICE

(71) Applicant: Semtech Corporation, Camarillo, CA (US)

(72) Inventors: Chaouki Rouaissia, Neuchâtel (CH); Pascal Monney, San Diego, CA (US)

(73) Assignee: Semtech Corporation, Camarillo, CA (US)

( * ) Notice: Subject to any disclaimer, the term of this patent is extended or adjusted under 35 U.S.C. 154(b) by 0 days.

(21) Appl. No.: 17/688,300

(22) Filed: Mar. 7, 2022

(65) Prior Publication Data

US 2022/0334672 A1 Oct. 20, 2022

(30) Foreign Application Priority Data

Apr. 19, 2021 (EP) ..................................... 21169081

(51) Int. Cl.
*G06F 3/041* (2006.01)
*G06F 3/044* (2006.01)

(52) U.S. Cl.
CPC ............ *G06F 3/0418* (2013.01); *G06F 3/044* (2013.01); *G06F 2203/04107* (2013.01); *G06F 2203/04108* (2013.01)

(58) Field of Classification Search
CPC . G06F 2203/04107; G06F 2203/04108; G06F 3/0418; G06F 3/044; H03K 17/955; H03K 2217/94026; H03K 2217/94031; H03K 2217/960705; H03K 2217/960765
See application file for complete search history.

(56) References Cited

U.S. PATENT DOCUMENTS

| | | | |
|---|---|---|---|
| 9,582,111 B2 | 2/2017 | Rouaissia | |
| 2008/0047764 A1* | 2/2008 | Lee | G06F 3/0418 178/18.06 |
| 2008/0252474 A1* | 10/2008 | Nakamura | H03K 17/955 340/657 |
| 2010/0065341 A1* | 3/2010 | Jeon | G06F 3/04182 178/18.06 |
| 2011/0018558 A1* | 1/2011 | Saito | G06F 3/0447 324/676 |
| 2011/0163994 A1* | 7/2011 | Tang | G06F 3/04182 345/174 |
| 2012/0074961 A1 | 3/2012 | Herrmann | |
| 2014/0354582 A1* | 12/2014 | Horne | G06F 3/044 345/174 |
| 2020/0021680 A1* | 1/2020 | Rouaissia | H04M 1/72454 |
| 2020/0387249 A1* | 12/2020 | Shimada | G06F 3/044 |

FOREIGN PATENT DOCUMENTS

| | | |
|---|---|---|
| EP | 3416031 A1 | 12/2018 |
| EP | 3595176 A1 | 1/2020 |
| EP | 3796140 A1 | 3/2021 |

* cited by examiner

*Primary Examiner* — Hong Zhou
(74) *Attorney, Agent, or Firm* — Blank Rome LLP

(57) ABSTRACT

A capacitive sensor with a plurality of sense inputs connectable to capacitive sense electrodes and a common reference input, each sense input and the reference input can be put in a measure state, in a ground state, or in a shield state. The sensor can be equipped with external reference capacitors between each of the sense input and the common reference terminal. The reference capacitor can be read individually by selectively pulling one of the input terminals to ground and driving the other to be equipotential with the reference input.

14 Claims, 3 Drawing Sheets

MULTICHANNEL CAPACITIVE SENSOR DEVICE

RELATED APPLICATION

This application claims priority to European Application No. EP21169081.3, filed Apr. 19, 2021. The entire content of this application is hereby incorporated by reference.

TECHNICAL DOMAIN

The present invention concerns a multiple-input capacitive sensor. Embodiments of the invention relate to a capacitive sensor that has an improved stability of response in a small and economic package, as well as a portable electronic device, such as a smartphone, equipped with such a sensor for detecting proximity to a part of the user's body.

RELATED ART

Proximity awareness is a requirement in most recent smartphones and connected personal devices, where it is used to limit irradiation dose, to prevent accidental inputs on a touch display, to dim a backlit panel, and in many other cases. Document EP3796140 discloses a capacitive sensor that can be used among others to detect proximity of a user's body part in a portable phone, a tablet or a similar portable device.

Documents EP3595176 and U.S. Pat. No. 9,582,111 disclose multiple-input capacitive sensors usable in smartphone applications. These devices have a plurality of sense electrodes that can be used to improve the awareness to special situations, discriminate the direction of the approach, reject water or low-permittivity bodies, and other functions. These references disclose a reference capacitor that is used to calibrate the response of the sense electrodes.

A difficulty in capacitive proximity sensing is that the signal that is sought is very small. The approach of a hand, or of a part of the body is detected through a variation in the self-capacitance of a sense electrode that typically is a small fraction of one percent. This is even harder if one considers that the useful part of the capacitance signal may be covered by strong noise and interference signals, from the environment and from the smartphone itself. Thermal drifts are significative and can easily obliterate the capacitance variation that is sought.

Another problem of the devices used so far in these applications is that they must be integrated in highly miniaturized circuits where the space is extremely limited. There is therefore a need of devices with a reduced terminal number that can fit in small packages.

SHORT DISCLOSURE OF THE INVENTION

An aim of the present invention is the provision of a device that overcomes the shortcomings and limitations of the state of the art.

According to the invention, these aims are attained by the object of claim 1, and especially by a capacitive sensor device, comprising a capacitance-measuring circuit, a plurality of sense inputs and a reference input, each sense input terminal being connectable to a sense electrode, configured, in a first measurement mode, for driving the reference input to be equipotential with one of the sense inputs that is measured by the capacitance-measuring circuit and determine a value of the capacitance seen by the sense input that is measured unaffected by any capacitance between the sense input that is measured and the reference input and, in a second measurement mode, for measuring the capacitance seen at the reference input with the capacitance-measuring circuit while holding one sense input to ground and driving other sense inputs to be equipotential with the reference input, determining a value of a reference capacitor connected between the reference input and the sense input that is held to ground unaffected by any capacitance between the reference input and sense inputs that are driven to be equipotential to the reference input.

In a variant, or in other terms, the capacitive sensor device is configured to set selectively sense inputs and reference inputs in a ground state or in a shield state or in a measure state, whereby inputs in the ground state are held at ground or constant potential, inputs in the measure state are read by the capacitance-measuring circuit, and inputs in the shield state are held at the same potential as inputs in the measure state, wherein the capacitive sensor device is configured, in a first measurement, to select a sense input set the selected sense inputs in the low impedance state set other sense inputs in the shield state set the reference input in the measure state and measure with the capacitance-measuring circuit a reference capacitance seen at the reference input and, in a second measurement, set the reference input in the shield state and the selected sense input in the measure state and measure with the capacitance-measuring circuit a uncorrected capacitance seen at the selected sense input, the capacitive sensor device being further configured to generate a corrected capacitance for the selected sense input based on the uncorrected capacitance and the reference capacitance.

Dependent claims introduce useful but non-essential elements, such as a manner of correcting the capacitance by subtracting from the uncorrected capacitance the reference one, scaled by a determined factor; sensing and correcting the sense inputs repeatedly and in turn; controllable input units setting the corresponding sense input in the ground state, in the shield state or in the measure state on commands received from a processor.

Each of the sense inputs may be coupled with the common reference unit with an external reference capacitor that is dimensioned to provide a thermal coefficient close to that of the relevant sense electrode, but little or no sensitivity to the approach of external conducting bodies. The sense electrodes are customarily realized as copper areas on a printed circuit board and their thermal behaviour is heavily influenced by the dielectric properties of this substrate. The track to the sense electrodes contributes a good deal to the self-capacitance and to its thermal drift. The invention uses a separate reference capacitor for each sense input, thus allowing optimal drift compensation with no constrain on the placement of sense pad and reference capacitors, with a single additional input pin.

The capacitance-measuring circuit may determine the capacitance seen at an input by connecting the input to a variable voltage source and measuring the corresponding variation of electric charge.

The capacitive sensor may deliver a proximity signal based on said corrected capacitance to the host sensor, and this could cause a predetermined action such as: change a power of a radio transmitter, switch on or off a display backlight, enable or disable a tactile input interface. One of the sense inputs may be coupled with a radiofrequency antenna of the host system that doubles duty as proximity electrode.

SHORT DESCRIPTION OF THE DRAWINGS

Exemplar embodiments of the invention are disclosed in the description and illustrated by the drawings in which.

EXAMPLES OF EMBODIMENTS OF THE PRESENT INVENTION

Figure 1:
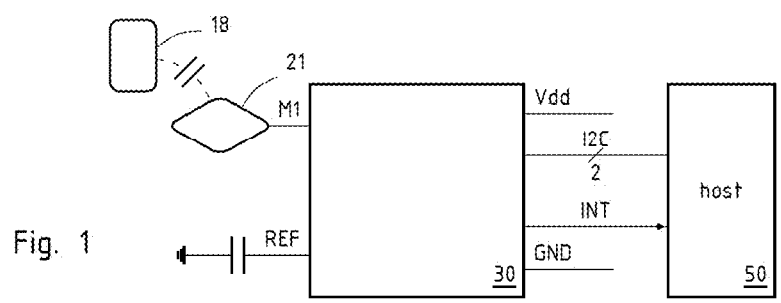
FIG. 1 illustrates schematically a capacitive proximity sensor of known type.

FIG. 1, shows, in simplified form a known type of capacitive proximity sensor. The circuit 30 has a sense input M1 that is connected to a capacitive pad 21. The circuit works by monitoring the self-capacitance of the pad 21 and detecting a tiny variation attributable to the approach of a conductive body 18. The circuit includes a second input REF that is connectable to an external capacitor Cr and is used for comparison and calibration.

The detector of FIG. 1 is generally part of a larger system, such as a portable phone or a tablet and communicates with a host processor 50 in any suitable way. It is common to use a standard serial communication bus such as I2C, to keep the pin count low, but dedicated lines for interrupt and data transmission are also possible. FIG. 1 shows a interrupt line (INT) between the sensor circuit 30 and the host 50, by way of example.

FIG. 1b shows a multi-channel capacitive detector 30 with six inputs. Three inputs M1, M2, M3 are used for capacitive electrodes 21, 22, 23, and three inputs R1, R2, R3 are used to read three independent reference capacitors 23, 24, 25. This solution allows to pair each sense input with an independent reference capacitor, and to dimension this capacitor in such a way that it compensates the drift of the corresponding sense electrodes.

Figure 2:
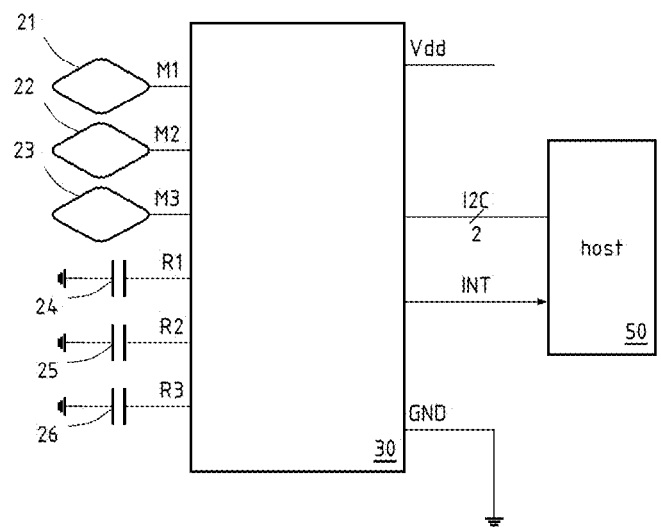
FIG. 2 shows a multiple-input variant of the single channel circuit of FIG. 1, with a plurality of reference capacitors, each read by a separate input.

The capacitive electrodes and the relative capacitors can be placed freely in the host system, and the connection tracks on the circuit board can be paired for an optical compensation. Importantly, different parts of a smartphone may not be at the same temperature, and this can be accounted for by placing reference capacitors close to the corresponding sense electrodes, or in places where they are expected to feel the same temperature changes. This flexibility, however, is acquired at the expense of a higher pin count: the sensor of FIG. 2 has the same footprint of a six-channel sensor.

Figure 3:
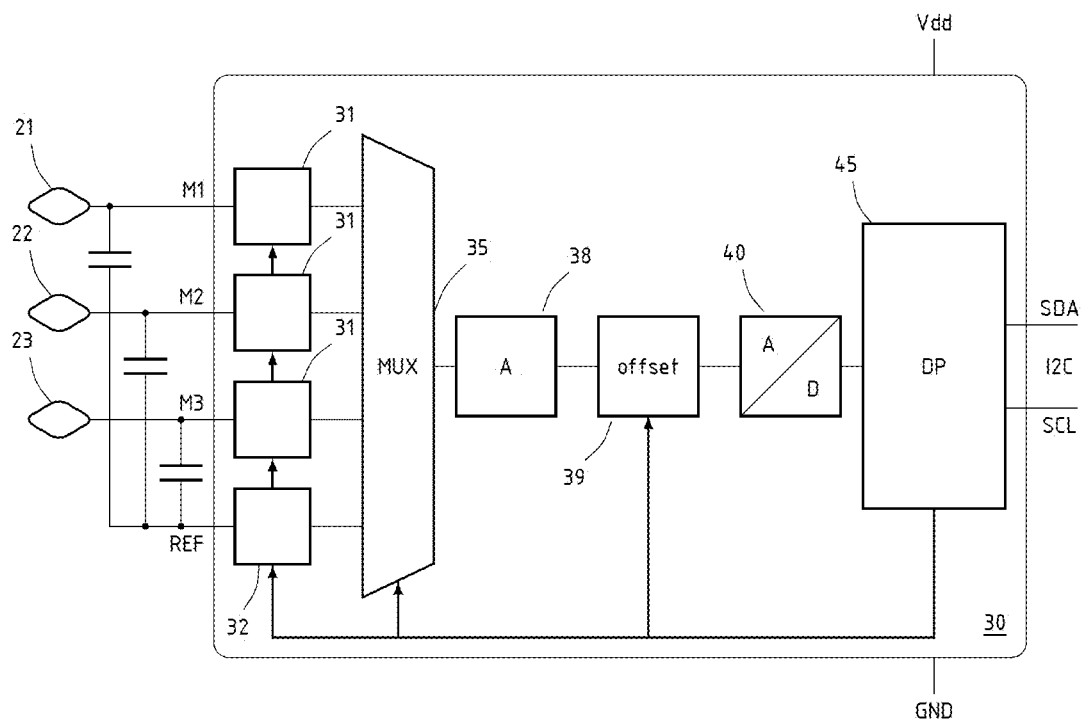
FIG. 3 shows an embodiment of the invention, in a schematic simplified form.

FIG. 3 shows an improved variant of the multi-channel capacitive detector 30. The detector has three sense inputs M1, M2, M3 connected to as many capacitive sense electrodes 21, 22, 23 and one common reference input R. Reference capacitor 24, 25, 26 are placed between each sense line, connecting an input to the respective electrode, and the common reference input R.

As it will be explained in the following, the capacitive detector is configured for selectively pulling one of the input terminals to ground and driving the other to be equipotential with the reference input. In this manner, the reference capacitors 24, 25, 26 can be read individually. Moreover, the capacitive detector 30 is configured for driving the reference input to be equipotential with one of the sense inputs that is measured. In this way, the reference capacitor 21, 22 or 23 connected to the sense input that is measured does not change the measure of the self-capacitance.

Internally, the capacitive detector 30 has an analog/digital converter 40 that transform the capacitance signal to a digital signal suitable for further processing in a digital processor 45. Preferably, a common converter is used to read the capacitances seen by the sense electrodes in turn, through a multiplexer 35. This is not an absolute requirement, however.

The input units 31, 32 are configured to set the corresponding input terminals to a desired stat chosen among a measure state, a ground state, and a shield state. In the measure state, the electric potential of the input is variable, following a variable voltage source in the capacitive sensor device, and the resulting variation of electric charge are sent to the ADC to determine a capacitance value. In the ground state the input is held at a constant voltage, either the voltage of the ground or shifted by a fixed value. In the shield state, the voltage at the input follows that of another input that is in the measure state, but the variations of electric charge are disregarded.

Figure 4:
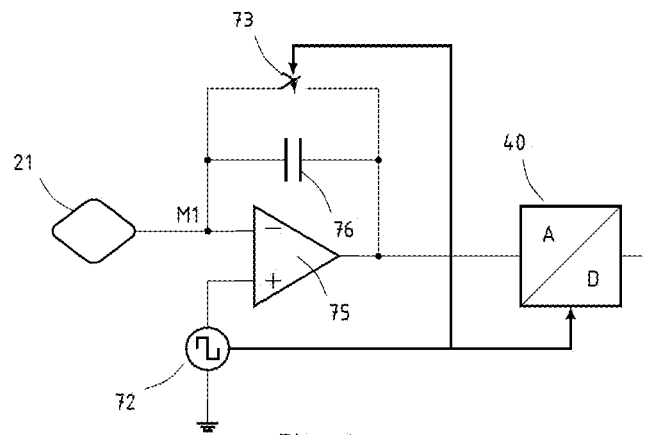
FIG. 4 shows a possible configuration of a capacitance to voltage converter in the invention.

FIG. 4 shows, in a very simplified form, a possible implementation of an input unit that causes the voltage at the input to follow a variable voltage source and could be used in the frame of this invention. This is provided for the completeness of the disclosure and by way of example, but the invention includes also other structures of input stages that can provide the desired function. The sense electrode 21 is connected to an inverting input of an amplifier 75, while the other input is driven by a voltage source 72 that can provide a variable voltage, or a constant voltage. Thanks to the feedback, the inverting input of the amplifier 75 a low impedance node and its voltage is the same as that of the voltage source 72 (possibly with a constant offset that has no importance in this application).

The ground state of the input M1 can be obtained by causing the source 72 to generate a constant voltage. The input M1 is then a virtual ground. The measure state and the shield state are obtained when the source 72 generates a variable voltage. The input M1 follows then that voltage.

The capacitance of the electrode 21 can be measured by causing the source 72 to generate a series of steps. The capacitor 76 connected in the reaction loop gives an integrator and the output of the amplifier 75 will show steps proportional to the variation of electric charge on the electrode 21. The ratio between the charge, measurable as a step voltage at the output of amplifier 75, and the known voltage steps of the source 72 is, by definition, the capacitance that is sought. The switch 73 is used to discharge periodically the reaction capacitor 76.

The output signal is digitized by ADC converter 40, preferably synchronously with the pulses of the source 72. The multiplexer 35, preamplifier 38 and offset correction 39 are not represented in this figure but could be present.

Returning to FIG. 3, the input stages 31, 32 generate a voltage signal that is related to the capacitance seen at the respective input and reference terminals M1-M3, REF. The detector may include an analogue conditioning stage, for example for filtering and amplification and/or a offset subtraction stage 39 before the ADC 40. The digital signal sampled by the ADC is then processed further un the digital processor 45 and made available to the host processor, for example through an I2C bus.

As mentioned above, the input stage could present different structures. The ground mode and the shield mode, for example, could foresee the activation of a switch connecting the input terminal to ground, respectively to a suitable variable source.

Figure 5:
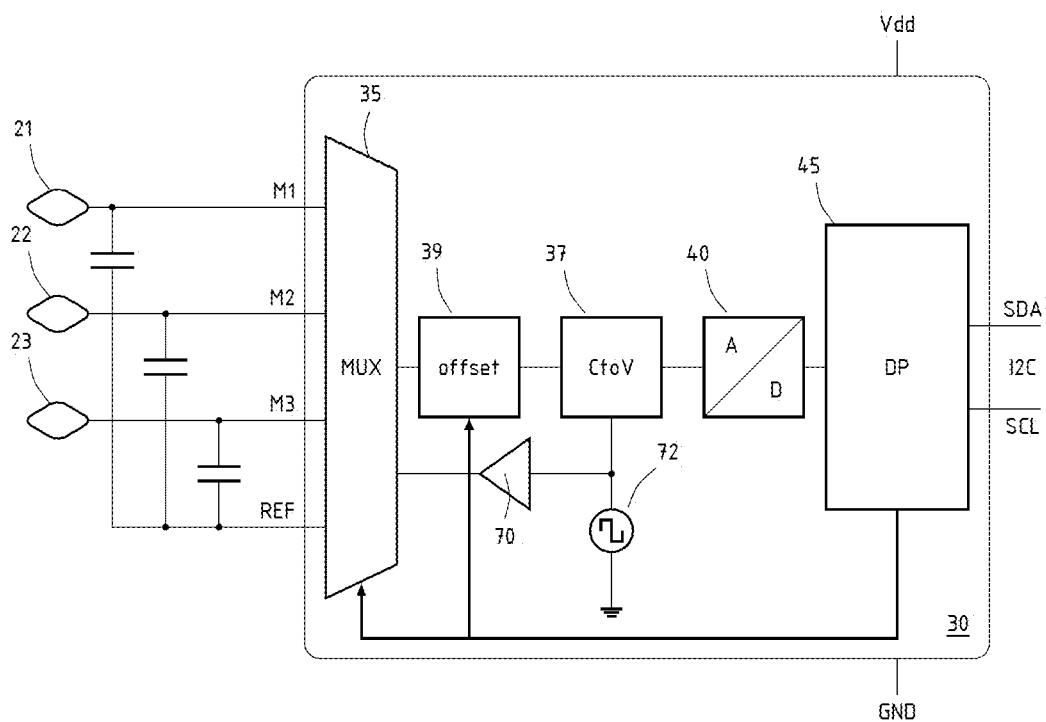
FIG. 5 shows a second embodiment of the invention, in a schematic simplified form.

FIG. 5 shows another embodiment of the invention in which the sense electrodes 21, 22, 23 are directly connected to a multiplexer 35 and the charge to voltage conversion is done after the multiplexer. In this variant, the inputs of the multiplexer 35 can be set individually in one state chose between a measure state, a shield state, a ground state or a high impedance state.

When one of the terminals M1, M2, M2 or REF is in the measure state, it is connected through the multiplexer 35 and the offset correction unit 39 to the capacitance to voltage converter 37. The capacitance to voltage converter may have the structure shown in FIG. 4, but this is not a requirement, as other circuits for transforming a capacitance into a voltage signal are known. As mentioned above, the electric potential of the input of circuit of FIG. 4 is variable and follows the voltage generated by a variable voltage source 72, for example a series of pulses, and integrates the charge received at the input. The output is a pulse signal whose amplitude is proportional to the capacitance seen at the input.

Inputs in the shield state are connected to the output of a buffer 70 that follows the variable source 72. They are at the same potential as the inputs in the measure state, but their capacitance is not measured.

Inputs in the ground state are connected to ground, by a selectable switch in the multiplexer 35, whereas input in the high-impedance state are essentially unconnected (floating).

The representations of FIGS. 3, 4 and 5 are simplified versions of full implementations of the invention, with blocks representing important functions, such as multiplexing, converting to digital, transforming a capacitance to a voltage, subtracting an offset, and so on. the reader understands that the invention is not limited to these examples but encompasses all the variants in the scope of the appended claims, including those in which some of the functions presented herein do not correspond to physically recognizable sub-circuits. It may be the case, for example, that some functions are combined in one circuit with shared elements or that they are implemented partly or totally by digital processing.

Importantly, the digital processor 45 is configured to command the states of the input units 32, 32 in a manner to obtain at will the self-capacitances of electrodes 21, 22, 23, and the capacitances of reference capacitors 25, 25, 26, as follows:

To measure the capacitance at one of the input electrodes, for example 21, the corresponding input M1 is set in measure mode, the reference input R is set in shield mode to suppress the effect of reference capacitor 24 (since this capacitor sees a zero or constant voltage, it conducts no current). The status of the inputs M2 M3 is in principle irrelevant. They can be set in the shield mode, in a high-impedance state, or to ground. Tests have shown that setting the non/used inputs to ground often provides the best performance but, other configuration may be advantageous in special cases. Preferably the unit of the invention is programmable and allows to choose any desired state for the non-connected inputs.

The capacitance of the reference capacitor 24 can be measured by putting the reference input R in measure mode, the first input M1 in ground mode, and the second and third inputs M2, M3 in shield mode.

The capacitances of electrodes M2, M3, respectively of reference capacitors 25, 26 can be measured in the same way, by replacing M1 with M2 or M3. The following table summarises the possible combinations.

TABLE 1

|    | M1      | R1 | M2      | R2 | M3      | R3 |
|----|---------|----|---------|----|---------|----|
| M1 | M       | G  | G, S, H | S  | G, S, H | S  |
| M2 | G, S, H | S  | M       | G  | G, S, H | S  |
| M3 | G, S, H | S  | G, S, H | S  | M       | G  |
| R  | S       | M  | S       | M  | S       | M  |

Each column of table 1 shows the configuration needed to read the capacitance of a give sense electrodes (M1, M2, M3) or corresponding reference capacitor (R1, R2, R3, indicated as 24, 25, 26 in FIG. 3). The states of the inputs M1, M2, M3, R, are abbreviated, wherein "M" stands for measure, "S" for shield, "G" for ground and "H" for the high-impedance (floating state). As mentioned above, the state of the non-considered inputs is not uniquely determined and can be chosen among ground, shield, or high-impedance, whichever gives the best performance.

Figure 6:
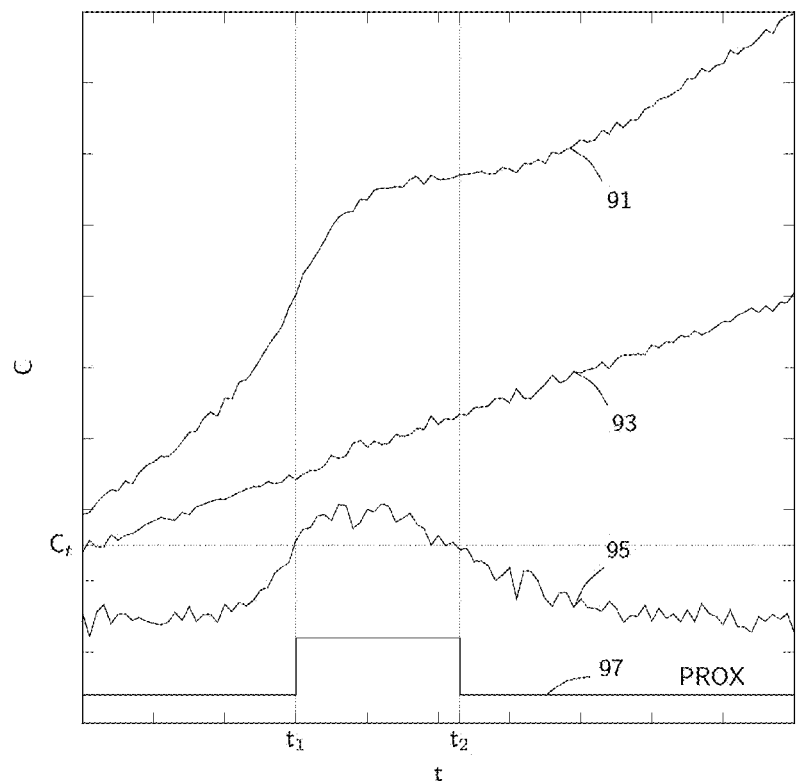
FIG. 6 is a plot of signals in the device of the invention, during the approach of a conductive body.

The plots in FIG. 6 show the values of the capacitances measured with the method outlined above, in a situation in which a conductive body—such as a part of the body of a user—approaches one sense electrode in the time interval between $t_1$ and $t_2$. The plots have been drawn with arbitrary shifts to improve readability.

Plot 91 represents the capacitance seen at the first sense electrode M1. It can be seen how the approach of the body is marked by an increase in capacitance on top of a rise, of approximately constant slope. The rise is in fact the effect of a temperature drift that changes the capacitance and, happening at a timescale considerably slower than the approach, appears as an approximately linear rise.

Plot 93 is the capacitance of the first reference capacitor R1, dimensioned and connected in such a way that it is subjected to the same temperature changes as the first sense electrode and has a comparable temperature drift. It shows a rise as the first plot but, since it is insensitive (or much less sensitive) to proximity, no significant increase in the interval ($t_1$, $t_2$).

Plot 95 is a signal M* obtained by combining the values of M1 and R1 to compensate the thermal drift. This can be obtained by a linear combination of M1 and R1, which can be expressed as M*=M1−k×R1, where k denotes a coefficient that can be predetermined in a calibration step. This compensation can be carried out in the processor 45.

Plot 97 shows a digital proximity signal obtained by comparing the value M* with a threshold $C_{th}$. This signal can be sent to the host system 50.

Figure 7:
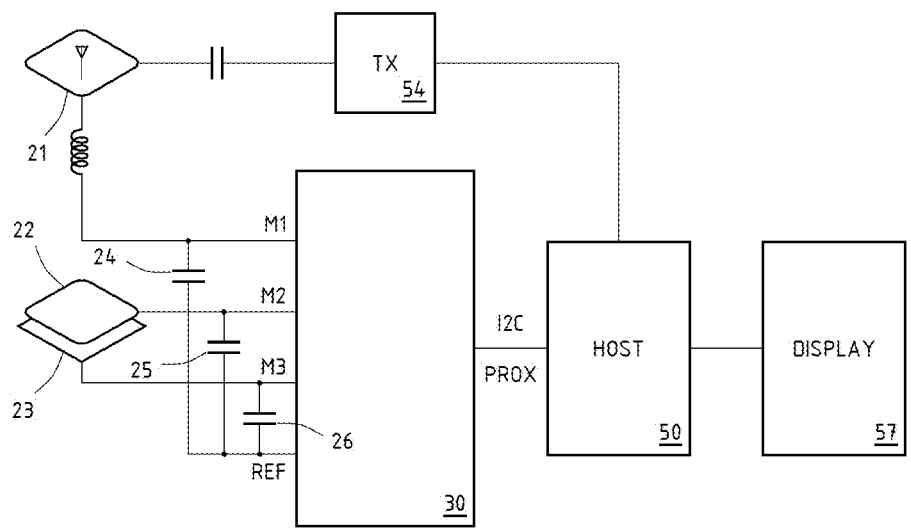
FIG. 7 shows a possible way of using the sensor of the invention in a host system.

FIG. 7 illustrates how the inventive capacitive detector 30 can be used as proximity detector in a personal connected device, such as a smartphone. The capacitive detector has three sense inputs M1, M2, M3 connected to as many capacitive sense electrodes that are realized as conductive areas on a circuit board, or in any other suitable way. The electrodes can assume many shapes and positions according to the needs. The number of input channel is not limited either, and could be higher or lower than three, according to the needs.

In the example illustrated on FIG. 7, the first sense input M1 is connected to a planar antenna 21 that is coupled to a radio transceiver 54 and doubles service as sense electrode. In this configuration the capacitance C1*, corrected as disclosed above, can be used to determine if a part of the user's body is close to the antenna 21.

Sense inputs M2 and M3 are connected to two electrodes 22 and 23 that are close to one another, or superposed. The compared examination of the corrected capacitances C2* and C3* can give information on the proximity of a part of a user body and on the direction of its approach.

The processor in the detector 30 transforms the corrected capacitances into digital proximity flags and transmits them to a processor in the host system 50. The host system 50 is configured to take determined actions on the activation or the deactivation of the proximity flags. For example, an approach to the antenna may trigger a reduction of the radio power to limit the absorbed dose. An approach coming from the screen may lead to the inhibition of the tactile interface to avoid false entries, and so on.

REFERENCE SYMBOLS IN THE FIGURES 18 conductive body
21 sense electrode
22 sense electrode
23 sense electrode
24 reference capacitor
25 reference capacitor
26 reference capacitor
30 capacitive sensor device
31 input control stage
32 input control stage
35 multiplexer
37 capacitance to voltage converter
38 analogue pre-processor
39 offset subtraction
40 ADC
45 digital processor
50 host
54 transceiver
57 display
70 buffer
72 voltage source
73 reset switch
75 amplifier
76 feedback capacitor
91 uncorrected sense capacitance
93 reference capacitance
95 corrected sense capacitance
97 digital proximity signal
M1, M2, M3 sense inputs
R reference input

The invention claimed is:

1. A capacitive sensor device comprising a capacitance-measuring circuit, a plurality of sense inputs and a reference input, each sense input being connectable to a sense electrode, the capacitive sensor device being configured, in a first measurement mode, for driving the reference input to be equipotential with one of the sense inputs that is measured by the capacitance-measuring circuit and determine a value of the capacitance seen by the sense input that is measured unaffected by any capacitance between the sense input that is measured and the reference input, and, in a second measurement mode, for measuring the capacitance seen at the reference input with the capacitance-measuring circuit while holding one sense input to ground and driving other sense inputs to be equipotential with the reference input, determining a value of the reference capacitor connected between the reference input and the sense input that is held to ground unaffected by any capacitance between the reference input and sense inputs that are driven to be equipotential to the reference input.

2. The capacitive sensor device of claim 1, the capacitive sensor device being configured to set selectively sense inputs and reference input in a ground state or in a shield state or in a measure state, whereby inputs in the ground state are connected to a low impedance node that could be the ground, inputs in the measure state are read by the capacitance-measuring circuit, and inputs in the shield state are held at the same potential as inputs in the measure state, wherein the capacitive sensor device is configured, in the second measurement mode, to select a sense input, set the selected sense inputs in the ground state, set other sense inputs in the shield state set the reference input in the measure state and measure with the capacitance-measuring circuit a reference capacitance seen at the reference input and, in the first measurement mode, set the reference input in the shield state and the selected sense input in the measure state and measure with the capacitance-measuring circuit an uncorrected capacitance seen at the selected sense input.

3. The capacitive sensor device of claim 1, further configured to generate a corrected capacitance for the selected sense input based on the uncorrected capacitance and the reference capacitance.

4. The capacitive sensor device of claim 1, wherein the generation of a corrected capacitance comprises multiplying the reference capacitance by a predetermined factor and subtracting the resulting value from the uncorrected capacitance.

5. The capacitive sensor device of claim 1, configured to select the sense inputs repeatedly and in turn and generate corrected capacitances for each of the sense inputs.

6. The capacitive sensor device of claim 1, comprising a processing unit, the sense inputs having a controllable input unit that is configured to accept a command from the processing and, based on said command, set the corresponding sense input in a ground state, in the shield state or in the measure state.

7. The capacitive sensor device of claim 6, the reference input having a controllable input unit that is configured to accept a command from the processing and, based on said command, set the reference input in the shield state or in the measure state.

8. The capacitive sensor device of claim 1, wherein each of the sense input is coupled through an external reference capacitor with the reference input.

9. The capacitive sensor device of claim 8, wherein the sense inputs are coupled with capacitive sense electrodes, whose self-capacitance changes at an approach of a conductive body, and the external reference capacitors have a temperature coefficient that is same or proportional to the temperature coefficient of the capacitive sense electrodes.

10. The capacitive sensor device of claim 9, wherein the capacitive sense electrodes are conductor areas on a printed circuit board, and the external reference capacitors include tracks and/or conductor areas on the same board or on a bord of same characteristics, and the capacitances of the external sense electrodes is less affected by the approach of the conductive body.

11. The capacitive sensor device of claim 1, wherein the capacitance-measuring circuit determines the capacitance seen at an input by connecting the input to a variable voltage source and measuring the corresponding variation of electric charge.

12. The capacitive sensor device of claim 1 and a portable electronic device, wherein the capacitive sensor device is configured to generate a proximity signal based on a corrected capacitance, and the portable electronic device is configured to activate a predetermined action when the proximity signal is generated and/or when the proximity signal is extinguished.

13. The capacitive sensor device and portable electronic device of claim 12, wherein the action is one of: change a power of a radio transmitter, switch on or off a display backlight, enable or disable a tactile input interface.

14. The capacitive sensor device and portable electronic device of claim 12, wherein at least one of the sense inputs is coupled with a radiofrequency antenna whose self-capacitance changes at an approach of a conductive body.

* * * * *